US012604656B2

(12) United States Patent
Xia et al.

(10) Patent No.: US 12,604,656 B2
(45) Date of Patent: Apr. 14, 2026

(54) LARGE-AREA PEROVSKITE LAYER AND PREPARATION METHOD THEREFOR

(71) Applicant: TRINA SOLAR CO., LTD, Changzhou (CN)

(72) Inventors: Rui Xia, Changzhou (CN); Yiqi Chen, Changzhou (CN); Yao Wang, Changzhou (CN); Yang Zou, Changzhou (CN); Chengfa Liu, Changzhou (CN); Xueling Zhang, Changzhou (CN); Daming Chen, Changzhou (CN); Yifeng Chen, Changzhou (CN)

(73) Assignee: TRINA SOLAR CO., LTD, Changzhou (CN)

( * ) Notice: Subject to any disclaimer, the term of this patent is extended or adjusted under 35 U.S.C. 154(b) by 135 days.

(21) Appl. No.: 18/289,358

(22) PCT Filed: Sep. 27, 2022

(86) PCT No.: PCT/CN2022/121561
§ 371 (c)(1),
(2) Date: Nov. 2, 2023

(87) PCT Pub. No.: WO2023/051494
PCT Pub. Date: Apr. 6, 2023

(65) Prior Publication Data
US 2024/0373744 A1 Nov. 7, 2024

(30) Foreign Application Priority Data
Sep. 28, 2021 (CN) .......................... 202111141263.0

(51) Int. Cl.
H10K 85/50 (2023.01)
C07F 7/24 (2006.01)
(Continued)

(52) U.S. Cl.
CPC ............... H10K 85/50 (2023.02); C07F 7/24 (2013.01); H10K 30/57 (2023.02); H10K 71/15 (2023.02)

(58) Field of Classification Search
CPC ......... H10K 85/50; H10K 30/57; H10K 71/15
See application file for complete search history.

(56) References Cited

U.S. PATENT DOCUMENTS

2016/0251303 A1* 9/2016 Moore ................... B05D 1/005
428/220
2022/0115602 A1* 4/2022 Snaith .................. H10K 85/111
(Continued)

FOREIGN PATENT DOCUMENTS

CN 108417722 A 8/2018
CN 109888105 A 6/2019
(Continued)

OTHER PUBLICATIONS

International Search Report for corresponding Application No. PCT/CN2022/121561 dated Nov. 24, 2022, 4 pages.
(Continued)

*Primary Examiner* — Jayne L Mershon
(74) *Attorney, Agent, or Firm* — Taft, Stettinius & Hollister LLP

(57) ABSTRACT

The present application provides a large-area perovskite layer and a preparation method thereof. The preparation method includes: dissolving raw materials of a perovskite in an ionic liquid or in a mixture of the ionic liquid and an organic solvent, thereby forming a perovskite precursor, and coating the perovskite precursor onto a surface of a crystalline silicon bottom cell, thereby forming the perovskite layer.

14 Claims, 3 Drawing Sheets

(51) Int. Cl.
    *H10K 30/57*        (2023.01)
    *H10K 71/15*        (2023.01)

(56)              References Cited

U.S. PATENT DOCUMENTS

| | | | |
|---|---|---|---|
| 2022/0158104 A1* | 5/2022 | Kinge | H10K 85/50 |
| 2022/0209039 A1* | 6/2022 | Lee | H10F 77/315 |

FOREIGN PATENT DOCUMENTS

| | | | |
|---|---|---|---|
| CN | 110718632 A | | 1/2020 |
| CN | 111952456 A | | 11/2020 |
| CN | 112071988 A | | 12/2020 |
| CN | 112542549 | * | 3/2021 |
| CN | 112542549 A | | 3/2021 |
| CN | 113193002 A | | 7/2021 |

OTHER PUBLICATIONS

Written Opinion for corresponding Application No. PCT/CN2022/121561 dated Nov. 24, 2022, 4 pages.

Chinese Patent Office, First Office Action issued in corresponding Application No. 202111141263.0, dated Apr. 10, 2025, 12 pp.

European Patent Office, Extended Search Report issued in corresponding Application No. 22874879.4, dated Jul. 18, 2025, 9 pp.

\* cited by examiner spin coating heating treatment

LARGE-AREA PEROVSKITE LAYER AND PREPARATION METHOD THEREFOR

CROSS-REFERENCE TO RELATED APPLICATIONS

This application is an U.S. national phase application under 35 U.S.C. § 371 based upon international patent application No. PCT/CN2022/121561 filed on Sep. 27, 2022, which itself claims priority to Chinese patent application No. 202111141263.0, filed on Sep. 28, 2021. The contents of the above identified applications are hereby incorporated herein in their entireties by reference.

TECHNICAL FIELD

The present application belongs to the technical field of solar cells, in particular to a large-area perovskite layer and a preparation method thereof.

BACKGROUND

The energy conversion efficiency is one of the key properties of solar cell devices. As the dominating products in the photovoltaic market, crystalline silicon solar cells have a bandgap of 1.12 eV of the absorbing material, and thus cannot efficiently harness the short-wavelength light in the solar spectrum. On the other hand, perovskite materials, which have received continuous attention in the photovoltaic field in recent years, can achieve controllable tuning of their bandgap within a range from 1.5 eV to 2.3 eV by modifying the composition of the perovskite materials. In addition, the perovskite materials are cost-effective and easy to prepare. By depositing a perovskite cell with a wide bandgap onto the top of a crystalline silicon cell as a substrate, a tandem solar cell can be formed. This structure allows for a significant expansion of the spectral response, thereby greatly enhancing the device efficiency with only a minimal increase in cost. The two-terminal tandem solar cell, including the crystalline silicon cell as the bottom cell and the perovskite cell as the top cell, can have a theoretical efficiency of up to 44%, making it a highly promising next generation photovoltaic technology with the potential to revolutionize the market.

However, perovskite materials are sensitive to environmental factors such as moisture and oxygen, and thus most of the high-efficiency perovskite solar cells are prepared in glove boxes. However, in conventional technical solutions, the preparation of perovskite precursor solutions still involves contact with moisture and oxygen in the air. On the one hand, some solvents which are miscible with water can easily absorb moisture, and the moisture entered the precursor solution is not easy to be removed. On the other hand, the components in the precursor are susceptible to oxidation, causing insufficient reactions therebetween and forming defects, and thus adversely affecting the device performance. In order to commercialize the perovskite tandem cells, it is essential that the devices can be prepared in the air and be adaptable to humidity change.

CN109065725A discloses a method for preparing a highly efficient and stable perovskite solar cell by introducing a surfactant to a perovskite layer. The perovskite solar cell consists of a conductive glass substrate, an electron transport layer, a perovskite layer, a hole transport layer, and a metal electrode, which are stacked in sequence. In this invention, the perovskite layer is prepared by introducing the cationic surfactant to a perovskite precursor solution and regulating the amount of the cationic surfactant. As a result, surface defects of the film can be reduced, morphology and crystallinity of the perovskite active layer can be regulated, and photoelectric conversion efficiency and stability of the perovskite solar cell can be improved. The invention provides a new route for preparing the highly efficient and stable perovskite solar cells. The method in the invention is simple and cost-effective, and can improve the photovoltaic performance and stability of the perovskite solar cells, thus having a good commercial application prospect.

CN110718632A discloses a method for preparing a large-area perovskite layer and a perovskite solar cell. The method includes the following steps: coating a perovskite precursor solution onto a substrate to form a perovskite precursor layer, adding a mixed anti-solvent, and annealing to prepare a perovskite layer. The mixed anti-solvent is a mixed solvent formed by mixing a solvent A with a solvent B. The solvent A is selected from any one of toluene, chlorobenzene, dichloromethane, ethyl acetate, anisole, and ether, and the solvent B is selected from any one of toluene, chlorobenzene, dichloromethane, ethyl acetate, anisole, and a monohydric alcohol of 3 to 6 carbon atoms. The solvent A is different from the solvent B, and the volume ratio of the solvent A to the mixed anti-solvent is 10% to 90%. This invention adopts the mixed anti-solvent to reduce the supersaturation of the perovskite precursor solution in the crystallization process, resulting in uniform generation of crystallization nucleation sites. The end product is a uniform perovskite film with a large grain size, which has a good application prospect in preparing a large-area perovskite device.

SUMMARY

The following is a summary of the subject matter detailed in the description. The summary is not intended to limit the protection scope of the claims.

An objective of the present application is to provide a large-area perovskite layer and a preparation method thereof. A perovskite precursor is formed by dissolving raw materials of a perovskite in an ionic liquid or in a mixture of the ionic liquid and an organic solvent, reducing the influence of ambient moisture and oxygen on the perovskite precursor, allowing for the preparation of the perovskite layer in an air atmosphere, and further in combination with a coating method, allowing for the preparation of a large-scale perovskite layer, which is suitable for an industrial production.

In order to achieve the above objective, the present application adopts the following technical solutions:

In a first aspect, the present application provides a method for preparing a large-area perovskite layer. The method includes:

dissolving raw materials of a perovskite in an ionic liquid or in a mixture of the ionic liquid and an organic solvent, thereby forming a perovskite precursor; and coating the perovskite precursor onto a surface of a substrate, thereby forming the perovskite layer.

In the present application, the raw materials of the perovskite are dissolved in the ionic liquid or in the mixture of the ionic liquid and the organic solvent, reducing the influence of ambient moisture and oxygen in the preparation of the perovskite layer from the perovskite precursor. Further, in combination with the coating operation, a large-area perovskite layer can be more efficiently prepared in an air atmosphere, thereby improving the production efficiency of a perovskite-based cell. Furthermore, the perovskite layer prepared in the present application has a uniform morphology. The method is characterized by its simplicity, suitability for industrial production, and cost-effectiveness.

As an optional technical solution of the present application, the preparation of the large-area perovskite layer is performed in an air atmosphere.

As an optional technical solution of the present application, the raw materials of the perovskite include a metal halide and an additive.

Optionally, a molar ratio of the metal halide to the additive is in a range from 0.5:1 to 1.5:1, and for example, is 0.5:1, 0.6:1, 0.7:1, 0.8:1, 0.9:1, 1.0:1, 1.1:1, 1.2:1, 1.3:1, 1.4:1, or 1.5:1.

Optionally, the metal halide includes one or more of $SnI_2$, $SnBr_2$, $SnF_2$, $SnCl_2$, $PbI_2$, $PbBr_2$, or $PbCl_2$.

Optionally, the additive includes one or more of $CH_3NH_3I$, $CH_3NH_3Cl$, $CH_3NH_3Br$, $CH_2(NH_2)_2I$, $CH_2(NH_2)_2Br$, $CH_2(NH_2)_2Cl$, CsI, RbI, KI, CsBr, or CsCl.

As an optional technical solution of the present application, a molar concentration of the raw materials of the perovskite in the perovskite precursor is in a range from 0.1 mol/L to 5 mol/L, and for example, is 0.1 mol/L, 0.5 mol/L, 1.0 mol/L, 1.5 mol/L, 2.0 mol/L, 2.5 mol/L, 3.0 mol/L, 3.5 mol/L, 4.0 mol/L, 4.5 mol/L, or 5.0 mol/L.

Optionally, a volume ratio of the organic solvent to the ionic liquid is in a range from 0:1 to 1000:1, and for example, is 10:1, 50:1, 100:1, 200:1, 300:1, 400:1, 500:1, 600:1, 700:1, 800:1, 900:1, or 1000:1, and further optionally is in a range from 0:1 to 100:1.

As an optional technical solution of the present application, the ionic liquid includes one or more of 1,1,1-trifluoroethyl ammonium iodide, methylamine formate, methylamine acetate, methylammonium difluoroacetate, or 1-butyl-3-methylimidazolium tetrafluoroborate.

Optionally, the organic solvent includes one or more of N, N-dimethylformamide, dimethyl sulfoxide, tetramethylene sulfoxide, sulfolane, or N-methylpyrrolidone.

As an optional technical solution of the present application, the coating includes: firstly, coating the perovskite precursor onto a surface of a substrate; and then spin coating to remove most of the remaining solvent in the perovskite precursor on the surface of the substrate.

Optionally, the substrate includes one or more of a glass substrate deposited with ITO, a glass substrate deposited with FTO, a polyimide flexible substrate, a naphthalene ethylene glycol diacetate flexible substrate, or a crystalline silicon substrate.

Optionally, the crystalline silicon substrate includes one or more of a monocrystalline silicon wafer, a doped monocrystalline silicon wafer, a polycrystalline silicon wafer, a doped polycrystalline silicon wafer, an amorphous silicon wafer, or a doped amorphous silicon wafer.

As an optional technical solution of the present application, the coating speed is in a range from 0.01 m/s to 1 m/s, and for example, is 0.01 m/s, 0.05 m/s, 0.1 m/s, 0.2 m/s, 0.3 m/s, 0.4 m/s, 0.5 m/s, 0.6 m/s, 0.7 m/s, 0.8 m/s, 0.9 m/s, or 1.0 m/s.

Optionally, a spinning speed of the spin coating is in a range from 100 rpm to 6000 rpm, and for example, is 100 rpm, 600 rpm, 1200 rpm, 1800 rpm, 2400 rpm, 3000 rpm, 3600 rpm, 4200 rpm, 4800 rpm, 5400 rpm, or 6000 rpm.

Optionally, a time period of the spin coating is in a range from 10 seconds(s) to 1000 s, and for example, is 10 s, 50 s, 100 s, 200 s, 300 s, 400 s, 500 s, 600 s, 700 s, 800 s, 900 s, or 1000 s.

Optionally, the spin coating is performed with a spin coater.

As an optional technical solution of the present application, the method further includes a heating treatment after the coating.

Optionally, a temperature of the heating treatment is in a range from 70° C. to 150° C., and for example, is 70° C., 80° C., 90° C., 100° C., 110° C., 120° C., 130° C., 140° C., or 150° C.

Optionally, a time period of the heating treatment is in a range from 1 minutes (min) to 120 min, and for example, is 1 min, 5 min, 10 min, 20 min, 30 min, 40 min, 50 min, 60 min, 70 min, 80 min, 90 min, 100 min, 110 min or 120 min, and further optionally is in a range from 10 min to 60 min.

As an optional technical solution of the present application, the preparation method specifically includes the following steps:

(I) in an air atmosphere, mixing a metal halide with an additive at a molar ratio of 0.5:1 to 1.5:1, and dissolving in the mixture of the ionic liquid and the organic solvent, thereby forming the perovskite precursor, wherein a volume ratio of the organic solvent to the ionic liquid is in a range from 0:1 to 1000:1, and a molar concentration of the raw materials of the perovskite in the perovskite precursor is in a range from 0.1 mol/L to 5 mol/L;

(II) coating the perovskite precursor onto the surface of the substrate at a speed of 0.01 m/s to 1 m/s; spin coating for 10 s to 1000 s at 100 rpm to 6000 rpm; and then heating at 70° C. to 150° C. for 1 min to 120 min, thereby preparing the perovskite layer.

In a second aspect, the present application provides a large-area perovskite layer. The large-area perovskite layer has a uniform morphology, and the large-area perovskite layer is prepared by the method for preparing the large-area perovskite layer according to the first aspect.

As an optional technical solution of the present application, a bandgap of the large-area perovskite layer is in a range from 1.3 eV to 1.8 eV, and for example, is 1.30 eV, 1.35 eV, 1.40 eV, 1.45 eV, 1.50 eV, 1.53 eV, 1.56 eV, 1.59 eV, 1.62 eV, 1.65 eV, 1.68 eV, 1.71 eV, 1.74 eV, 1.77 eV, or 1.80 eV.

Optionally, an area of the large-area perovskite layer is in a range from 5 cm$^2$ to 1000 cm$^2$, and for example, is 5 cm$^2$, 10 cm$^2$, 50 cm$^2$, 100 cm$^2$, 200 cm$^2$, 300 cm$^2$, 400 cm$^2$, 500 cm$^2$, 600 cm$^2$, 700 cm$^2$, 800 cm$^2$, 900 cm$^2$, or 1000 cm$^2$.

The numerical ranges described in the present application include not only the specific values exemplified above, but also any intermediate values unexemplified but within the numerical ranges. As limited by the document length and for the sake of brevity, the specific values included in the ranges are not exhaustively listed in the present application.

Compared with the related art, the present application provides the following beneficial effects:

In the present application, the raw materials of the perovskite are dissolved in the ionic liquid or in the mixture of the ionic liquid and the organic solvent, reducing the influence of ambient moisture and oxygen in the preparation of the perovskite layer from the perovskite precursor. Further, in combination with the coating operation, a large-area perovskite layer can be more efficiently prepared in an air atmosphere, thereby improving the production efficiency of a perovskite-based cell. Furthermore, the perovskite layer prepared in the present application has a uniform morphology. The method is characterized by its simplicity, suitability for industrial production, and cost-effectiveness.

Other aspects can be understood after reading and comprehending the drawings and the detailed description.

DETAILED DESCRIPTION

In order to better describe the present application and facilitate understanding of the technical solutions of the present application, the following further describes the present application in detail. However, the following embodiments are only simple examples of the present application, and do not represent or limit the protection scope of the present application. The protection scope of the present application is subject to the claims.

Example 1

Figure 1:
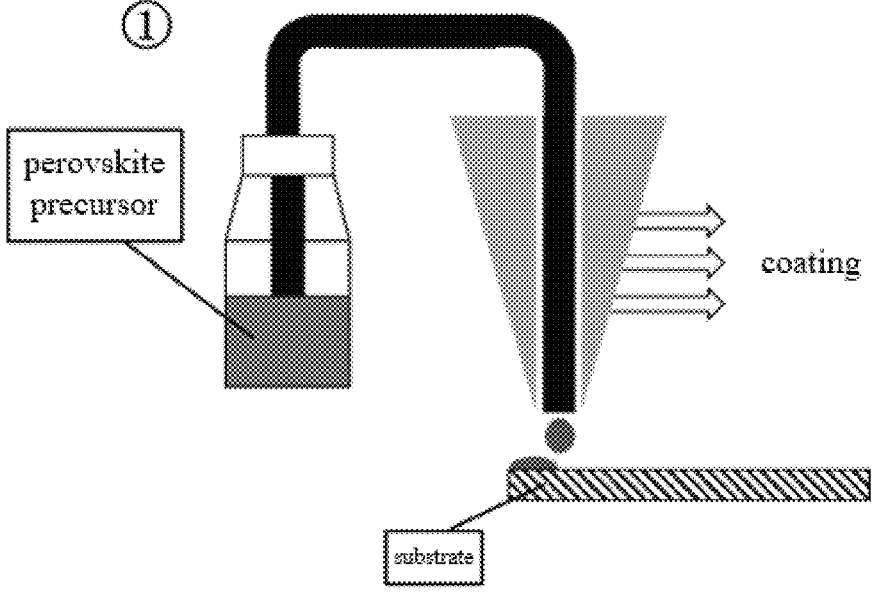
FIG. 1 is a schematic view showing a process of a method for preparing a large-area perovskite layer provided in Examples 1 to 4 of the present application.
Figure 1:
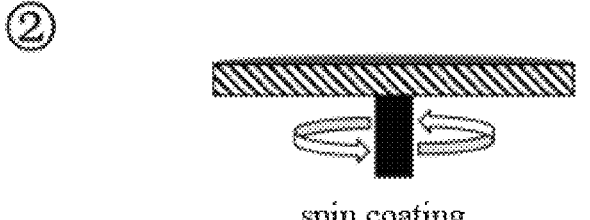
Figure 1:
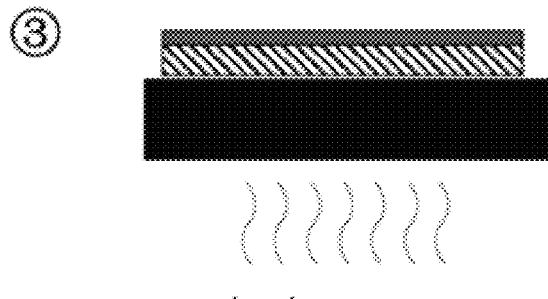

Referring to FIG. 1, the present example provides a method for preparing a large-area perovskite layer. The specific steps of the method are as follows:

(I) In an air atmosphere with a humidity of 30%, $PbI_2$ and an additive in a molar ratio of 1:1 are mixed together to form raw materials of a perovskite. The chemical formula of the perovskite is $FA_{0.8}Cs_{0.2}Pb(I_{0.75}Br_{0.25})_3$. The additive is a mixture of $CH_2(NH_2)_2Br$, CsI, and $CH_2(NH_2)_2I$. FA represents $CH_2(NH_2)_2^+$. The raw materials are dissolved in methylammonium difluoroacetate added with N, N-dimethylformamide to form a perovskite precursor. The volume ratio of N, N-dimethylformamide to methylammonium difluoroacetate is 3:7. The molar concentration of the raw materials of the perovskite in the perovskite precursor is 1.4 mol/L.

(II) The perovskite precursor is coated onto an edge of a silicon wafer sized 158*158 $mm^2$ at a speed of 0.05 m/s, then coated onto the entire surface of the silicon wafer by spin coating at 4000 rpm for 20 s using a spin coater, and then heated at 130° C. for 20 min, thereby obtaining the perovskite layer. The bandgap of the perovskite layer is 1.7 eV.

Example 2

Referring to FIG. 1, the present example provides a method for preparing a large-area perovskite layer. The specific steps of the method are as follows:

(I) In an air atmosphere with a humidity of 50%, $PbI_2$ and $CH_2(NH_2)_2I$ in a molar ratio of 1:1 are mixed together and dissolved in methylamine formate added with N, N-dimethylformamide to form a perovskite precursor. The volume ratio of N, N-dimethylformamide to methylamine formate is 2:8. The molar concentration of the raw materials of the perovskite in the perovskite precursor is 1.3 mol/L.

(II) The perovskite precursor is coated onto an edge of a silicon wafer sized 210*210 $mm^2$ at a speed of 0.01 m/s, then coated onto the entire surface of the silicon wafer by spin coating at 5000 rpm for 30 s using a spin coater, and then heated at 100° C. for 30 min, thereby obtaining the perovskite layer. The bandgap of the perovskite layer is 1.5 eV.

Example 3

Referring to FIG. 1, the present example provides a method for preparing a large-area perovskite layer. The specific steps of the method are as follows:

(I) In an air atmosphere with a humidity of 40%, $PbI_2$ and $CH_3NH_3Br$ in a molar ratio of 1.5:1 are mixed together and dissolved in 1,1,1-trifluoroethyl ammonium iodide to form a perovskite precursor. The molar concentration of the raw materials of the perovskite in the perovskite precursor is 1.4 mol/L.

(II) The perovskite precursor is coated onto an edge of a silicon wafer sized 158*158 $mm^2$ at a speed of 0.1 m/s, then coated onto the entire surface of the silicon wafer by spin coating at 100 rpm for 120 s using a spin coater, and then heated at 150° C. for 10 min, thereby obtaining the perovskite layer. The bandgap of the perovskite layer is 1.8 eV.

Example 4

Referring to FIG. 1, the present example provides a method for preparing a large-area perovskite layer. The specific steps of the method are as follows:

(I) In the air atmosphere with a humidity of 30%, $PbI_2$ and CsI in a molar ratio of 0.5:1 are mixed together and dissolved in methylamine acetate to form the perovskite precursor. The molar concentration of the raw materials of the perovskite in the perovskite precursor is 1.4 mol/L.

(II) The perovskite precursor is coated onto an edge of a silicon wafer sized 200*200 $cm^2$ at a speed of 1 m/s, and then coated onto the entire surface of the silicon wafer by spin coating at 6000 rpm for 25 s using a spin coater, and then heated at 70° C. for 120 min, thereby obtaining the perovskite layer. The bandgap of the perovskite layer is 1.6 eV.

Figure 2:
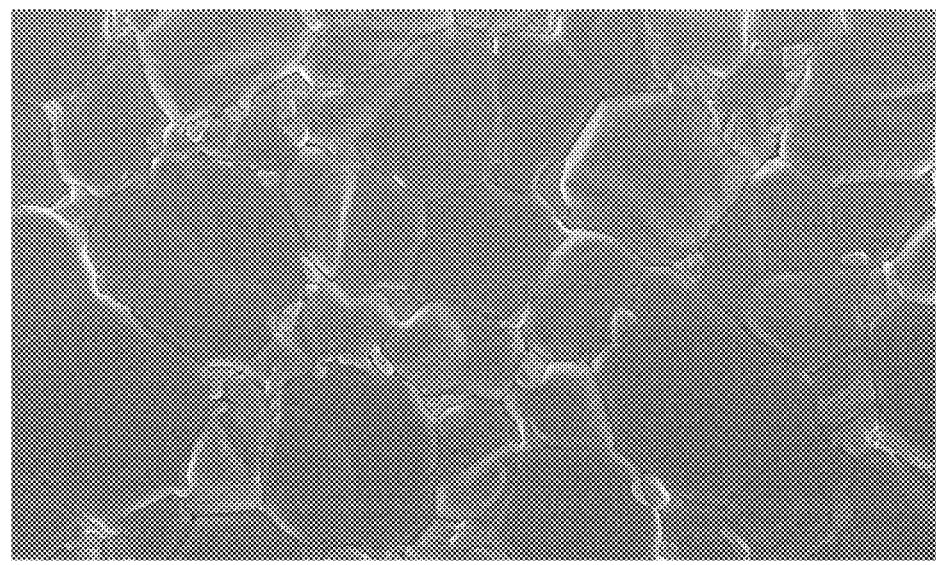
FIG. 2 is an image showing surface morphology of an edge area of a large-area perovskite layer provided in Example 1 of the present application.
Figure 3:
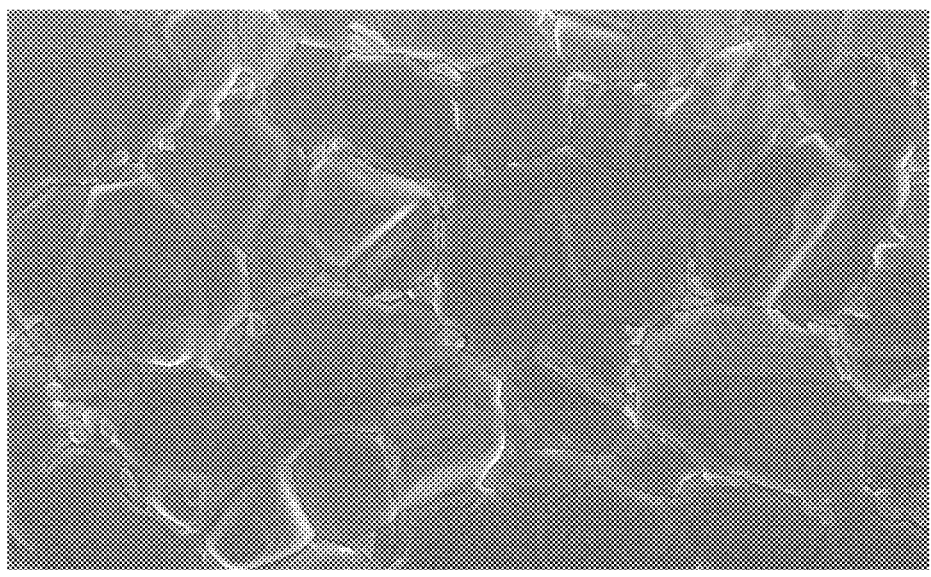
FIG. 3 is an image showing surface morphology of a center area of the large-area perovskite layer provided in Example 1 of the present application.
Figure 4:
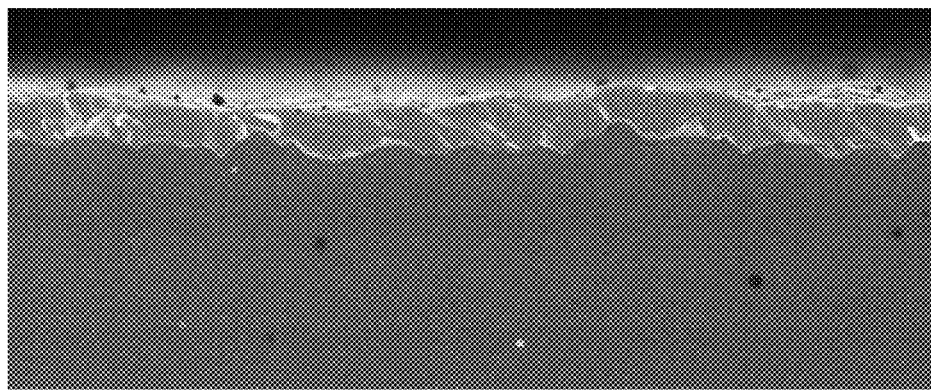
FIG. 4 is an image showing cross-sectional morphology of the edge area of the large-area perovskite layer provided in Example 1 of the present application.
Figure 5:
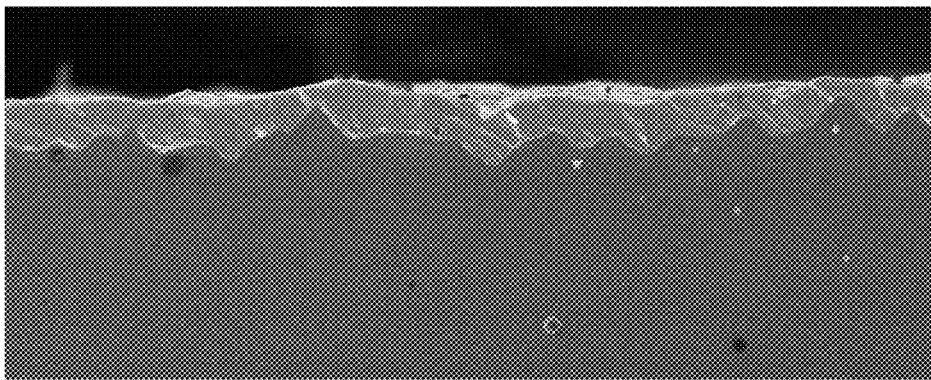
FIG. 5 is an image showing cross-sectional morphology of the center area of the large-area perovskite layer provided in Example 1 of the present application.

A surface and a cross-section of the large-area perovskite layer prepared in Example 1 were characterized by SEM, wherein FIG. 2 shows the surface morphology of the edge area of the silicon wafer, FIG. 3 shows the surface morphology of the center area of the silicon wafer, FIG. 4 shows the cross-sectional morphology of the edge area of the silicon wafer, and FIG. 5 shows the cross-sectional morphology of the center area of the silicon wafer.

Referring to FIG. 2 to FIG. 5, the raw materials of the perovskite are dissolved in the ionic liquid, reducing the influence of ambient moisture and oxygen in the preparation of the perovskite layer from the perovskite precursor solution. Further, in combination with the coating operation, a large-area perovskite layer can be more efficiently prepared in an air atmosphere, thereby improving the production efficiency of a crystalline silicon/perovskite tandem cell. Furthermore, the perovskite layer prepared in the present application has a uniform morphology. The method is capable of preparing a perovskite layer in an area of 5 $cm^2$ to 1000 $cm^2$, and is characterized by its simplicity, suitability for industrial production, and cost-effectiveness.

The applicant declares that the above-described embodiments are only specific implementations of the present application, and the scope of protection of the present application is not limited to these embodiments. It should be understood by those skilled in the art that any modifications or replacements obviously obtained by those skilled in the art within the scope of technology disclosed in the present application all fall within the scope of protection and disclosure of the present application.

What is claimed is:

1. A method for preparing a large-area perovskite layer, the method comprising:

dissolving raw materials of a perovskite in a mixture of an ionic liquid and an organic solvent, thereby forming a perovskite precursor; and coating the perovskite precursor onto a surface of a substrate at a speed of about 0.01 m/s to about 1 m/s, and then spin coating to process remaining solvent in the perovskite precursor on the surface of the substrate, thereby forming the perovskite layer on the substrate, wherein a volume ratio of the organic solvent to the ionic liquid is in a range of about 0.25:1 to about 100:1, and the ionic liquid is selected from the group consisting of 1,1,1-trifluoroethyl ammonium iodide, methylamine formate, methylammonium difluoroacetate, 1-butyl-3-methylimidazolium tetrafluoroborate, or a combination thereof.

2. The method according to claim 1, wherein the step of preparing of the large-area perovskite layer is performed in an air atmosphere.

3. The method according to claim 1, wherein the raw materials of the perovskite comprise a metal halide and an additive.

4. The method according to claim 3, wherein one or more of the following conditions are met:

a molar ratio of the metal halide to the additive is in a range from about 0.5:1 to about 1.5:1;

the metal halide comprises at least one of $SnI_2$, $SnBr_2$, $SnF_2$, $SnCl_2$, $PbI_2$, $PbBr_2$, or $PbCl_2$; and the additive comprises one or more of $CH_3NH_3I$, $CH_3NH_3Cl$, $CH_3NH_3Br$, $CH_2(NH_2)_2I$, $CH_2(NH_2)_2Br$, $CH_2(NH_2)_2Cl$, $CsI$, $RbI$, $KI$, $CsBr$, or $CsCl$.

5. The method according to claim 1, wherein a molar concentration of the raw materials of the perovskite in the perovskite precursor is in a range from about 0.1 mol/L to about 5 mol/L.

6. The method according to claim 1, wherein the organic solvent comprises at least one of N, N-dimethylformamide, dimethyl sulfoxide, tetramethylene sulfoxide, sulfolane, or N-methylpyrrolidone.

7. The method according to claim 1, wherein the substrate comprises at least one of a glass substrate deposited with ITO, a glass substrate deposited with FTO, a polyimide flexible substrate, a naphthalene ethylene glycol diacetate flexible substrate, or a crystalline silicon substrate.

8. The method according to claim 7, wherein the crystalline silicon substrate comprises at least one of a monocrystalline silicon wafer, a doped monocrystalline silicon wafer, a polycrystalline silicon wafer, a doped polycrystalline silicon wafer, an amorphous silicon wafer, or a doped amorphous silicon wafer.

9. The method according to claim 1, wherein at least one of the following conditions are met:

a spinning speed of the spin coating is in a range from about 100 rpm to about 6000 rpm;

a time period of the spin coating is in a range from about 10 s to about 1000 s; and the spin coating is performed with a spin coater.

10. The method according to claim 1, further comprising applying a heating treatment after the coating.

11. The method according to claim 10, wherein a temperature of the heating treatment is in a range from about 70° C. to about 150° C.; and a time period of the heating treatment is in a range from about 1 min to about 120 min.

12. The method according to claim 1, further comprising:

in an air atmosphere, mixing a metal halide with an additive at a molar ratio of about 0.5:1 to about 1.5:1, and dissolving in the mixture of the ionic liquid and the organic solvent, thereby forming the perovskite precursor, wherein a volume ratio of the organic solvent to the ionic liquid is in a range from about 0.25:1 to about 100:1, and a molar concentration of the raw materials of the perovskite in the perovskite precursor is in a range from about 0.1 mol/L to about 5 mol/L; and coating the perovskite precursor onto the surface of the substrate at a speed of about 0.01 m/s to about 1 m/s; spin coating for about 10 s to about 1000 s at about 100 rpm to about 6000 rpm; and then heating at about 70° C. to about 150° C. for about 1 min to about 120 min, thereby preparing the perovskite layer.

13. The method according to claim 1, wherein the substrate is a crystalline silicon solar cell.

14. A method for preparing a tandem solar cell, comprising preparing a large-area perovskite layer onto a crystalline silicon solar cell by the method according to claim 1, wherein the substrate is the crystalline silicon solar cell.

* * * * *